(12) United States Patent
Knowles

(10) Patent No.: US 6,933,932 B2
(45) Date of Patent: Aug. 23, 2005

(54) ACOUSTIC WAVE SENSOR WITH EMAT DRIVE

(75) Inventor: Terence J. Knowles, Barrington, IL (US)

(73) Assignee: TexZec, Inc., Round Rock, TX (US)

( * ) Notice: Subject to any disclaimer, the term of this patent is extended or adjusted under 35 U.S.C. 154(b) by 0 days.

(21) Appl. No.: 10/245,246

(22) Filed: Sep. 17, 2002

(65) Prior Publication Data

US 2004/0051701 A1 Mar. 18, 2004

(51) Int. Cl.[7] ............................................. G09G 5/00
(52) U.S. Cl. ..................................... 345/177; 178/18.04
(58) Field of Search ............................... 345/173–177, 345/156; 178/18.01–18.04; 73/589, 643, 645

(56) References Cited

U.S. PATENT DOCUMENTS

| | | | | |
|---|---|---|---|---|
| 4,242,541 | A | | 12/1980 | Ando ....................... 179/110 A |
| 5,073,878 | A | * | 12/1991 | Gilchrist ..................... 367/137 |
| 5,434,372 | A | * | 7/1995 | Lin ........................... 178/18.07 |
| 5,450,305 | A | * | 9/1995 | Boys et al. ..................... 363/24 |
| 5,673,041 | A | * | 9/1997 | Chatigny et al. ............. 341/22 |
| 5,808,202 | A | | 9/1998 | Passarelli, Jr. |
| 5,813,280 | A | | 9/1998 | Johnson et al. |
| 5,852,261 | A | * | 12/1998 | Toda ........................ 178/18.04 |
| 5,895,856 | A | | 4/1999 | Johnson et al. |
| 6,119,522 | A | | 9/2000 | Johnson et al. |
| 6,170,336 | B1 | | 1/2001 | Johnson et al. |
| 6,393,921 | B1 | * | 5/2002 | Grimes et al. ................. 73/728 |
| 6,519,343 | B1 | * | 2/2003 | Mansfield ................... 381/71.1 |

OTHER PUBLICATIONS

*Electromagnetic, Noncontact Transducers*, R.B. Thompson, Science Center, Rockwell International, pp. 385–392.
*Applications for Measurements of Shear–Wave Resonant Modes in Cylinders*, George A. Alers, Ward Johnson, E. Segal and B.A. Auld, National Institute of Standards and Technology, 1994 Ultrasonics Symposium, pp. 1103–1106.
*Excitation of Bulk Shear Waves in Steel By Magnetostrictive Coupling*, B. Igarashi, G.A. Alers, National Institute of Standards and Technology, 1998 IEEE Ultrasonics Symposium, pp. 893–896.
*Generation of Horizontally Polarized Shear Waves with EMAT Transducers*, G. Hübschen, English by R. Diederichs, NDT net Mar., 1998 vol. 3, No. 3.

* cited by examiner

Primary Examiner—Amare Mengistu
(74) Attorney, Agent, or Firm—McAndrews, Held & Malloy, Ltd.

(57) ABSTRACT

An acoustic wave sensor includes an electromagnetic acoustic transducer to generate a resonant acoustic wave substantially trapped in an acoustic wave cavity. The acoustic wave cavity is defined by a radially symmetric raised surface. The electromagnetic acoustic transducer includes a spiral primary coil to generate the acoustic wave in the acoustic wave cavity and a concentric spiral pickup coil to pick up an electrical signal representing the acoustic wave in the cavity. A noise canceling coil portion is used to cancel spurious noise induced by the primary coil from the pickup coil to provide an output signal representing the acoustic wave energy in the cavity 12.

43 Claims, 3 Drawing Sheets

ACOUSTIC WAVE SENSOR WITH EMAT DRIVE

CROSS-REFERENCE TO RELATED APPLICATIONS

This application is related to U.S. patent applications Ser. No. 09/998,355 filed Nov. 20, 2001 and Ser. No. 09/998,220, filed Nov. 20, 2001.

STATEMENT REGARDING FEDERALLY SPONSORED RESEARCH OR DEVELOPMENT

N/A

FIELD OF THE INVENTION

The present invention relates to an acoustic wave sensor and more particularly to an acoustic wave sensor having an electromagnetic acoustic transducer for generating a resonant acoustic wave in an acoustic wave cavity formed in the body of the sensor.

BACKGROUND OF THE INVENTION

There is a substantial need for finger touch actuated switches that are rugged and explosion proof, operate in the presence of liquids, have low power consumption, withstand aggressive sterilization procedures and are inexpensive. Known switches that attempt to meet these needs but fail include the following. A Qprox switch made by Quantum Research Group senses the presence of touch through a charge transfer effect. This switch is sensitive to conductive fluids and/or an ionizing atmosphere and can be made inoperable thereby. Further, the enclosure through which touch is sensed cannot be made of an electrically conducting material, so that metals and the like cannot be used. Piezoelectric switches such as supplied by Schurter or Wilson-Hurd, operate by transferring finger pressure via a metal overlay to a piezoelectric element which generates a voltage when compressed. This type of switch is expensive compared to a standard membrane switch and shares the disadvantages of membrane switches in that holes in the housing or enclosure are required to accommodate the switch. Further, the metal overlay is necessarily thin, so that the piezoelectric element is relatively unprotected against blows to the overlay. Another type of switch shown in U.S. Pat. No. 5,149,986 is based on the absorption of sound in a glass, ball-shaped button when the button is touched. In operation, a transducer sends sound waves into the glass balls and then receives back the echoes in a sonar type fashion. A circuit analyzes the echoes to determine whether the echoes have been reduced indicating a touch. This type of switch is relatively expensive and again requires openings in the housing or enclosure in which the switch is to be mounted.

An acoustic wave switch such as shown in U.S. Pat. No. 5,673,041 includes an ultrasonic piezoelectric transducer mounted on a surface of a substrate opposite a touch surface of the substrate. The transducer generates an ultrasonic wave that propagates in a direction across the thickness of the substrate to the touch surface and reflects off of the touch surface back to the transducer. The ultrasonic wave appears to be a compressional wave. A touch on the touch surface changes the acoustic reflectivity of the surface and changes the impedance of the transducer. The acoustic energy in this switch is not confined and spreads out into the plane of the substrate. As such, the ratio of the stored energy to lost or dissipated energy over a complete cycle, referred to as the Q of the switch, is inherently low and an extremely complex touch detection circuit is required to discriminate between a touch and the absence of a touch. Moreover, the use of compressional waves in this switch is undesirable due to their sensitivity to liquids and other contaminants which can render the switch inoperable.

Also known are acoustic wave touch panels that employ reflective gratings or arrays to reflect portions of an acoustic wave across a touch surface along parallel paths of differing lengths. These devices use a transparent substrate that can overlay a display to provide a touch screen or the like. Examples of such touch sensors are shown in U.S. Pat. Nos. 4,645,870 and 4,700,176 which utilize surface acoustic waves. These systems are undesirable, however, because surface acoustic waves are sensitive to liquids, sealing compounds and other contaminants that can render the panel inoperable and difficult to seal effectively. Another acoustic wave touch panel using reflective arrays is shown in U.S. Pat. No. 5,177,327. This touch panel uses shear waves and in particular the zeroth order horizontally polarized shear wave. Although this touch position sensor is insensitive to liquids and contaminants, touch position sensors that use reflective gratings or arrays and the associated touch detection circuitry are, in general, too expensive to use for an individual switch or for a small number of switches on a panel. Moreover, because the piezoelectric transducer in this latter system is mounted on a side of the panel to generate a shear wave that propagates in the plane of the substrate, an opening in the enclosure or housing is required to accommodate the panel. U.S. Pat. No. 5,573,077 also uses zeroth order horizontally polarized shear waves, but instead of reflective gratings, discrete piezoelectric transducers are used to propagate the shear waves along parallel paths extending across the substrate.

Although an Electromagnetic Acoustic Transducer (EMAT) is known for generating acoustic waves, this type of transducer has not been used in known acoustic wave switches or touch panels. That is because EMATs are very inefficient converters of electrical energy to acoustic wave energy. In known systems, tens of amps are needed to drive the coils of the EMAT wherein the current is pulsed to avoid overheating. The output signal picked up remains so weak in known systems that it must be amplified by a factor of ten thousand or so to be detected. As such, special amplifiers and electromagnetic shielding techniques are required as well as complicated signal processing circuits. Moreover, separate transmit and receive transducers are typically required. Another factor that limits the use of EMATs is that they require an electrically conducting substrate in which to induce the acoustic wave. Because of the associated problems, EMATs are typically used only in applications such as non-destructive testing for detecting flaws in large metal objects such as jet turbine compressor blades, rocket motor parts, etc. The use of EMATs in non-destructive testing takes advantage of the fact that an EMAT does not have to be physically attached to the object being tested.

BRIEF SUMMARY OF THE INVENTION

In accordance with the present invention the disadvantages of prior switches and sensors as discussed above have been overcome. An acoustic wave sensor of the present invention utilizes an electromagnetic acoustic transducer to generate a resonant acoustic wave substantially trapped in an acoustic wave cavity. The acoustic wave sensor can be used to sense contact with the acoustic wave cavity by a material that affects the acoustic wave trapped therein. For example, the acoustic wave sensor can be used to sense a touch on a touch surface of the acoustic wave cavity.

More particularly, the acoustic wave sensor of the present invention includes a body with an acoustic wave cavity formed therein and defined by a raised area. At least a portion of the acoustic wave cavity is formed of an electrically conducting material. An electromagnetic acoustic transducer is positioned adjacent to one surface of the acoustic wave cavity. The electromagnetic acoustic transducer includes a primary coil for generating a resonant acoustic wave in the acoustic wave cavity and a pickup coil for providing an electrical output signal.

In a preferred embodiment of the acoustic wave sensor, the electromagnetic acoustic transducer also includes a noise or spurious signal canceling coil. In one embodiment of the acoustic wave sensor of the present invention, the acoustic wave cavity overlies the primary coil and the pickup coil but does not overlie the noise canceling coil. In another embodiment of the acoustic wave sensor, the acoustic wave cavity overlies the noise canceling coil portion as well as the primary and pickup coil portions of the transducer.

In one embodiment of the present invention, the raised surface defining the acoustic wave cavity is radially symmetric and the coils of the electromagnetic acoustic transducer are concentric spiral coils. The raised area defining the acoustic wave cavity may be integrally formed as part of the body of the sensor. Alternatively, the raised area defining the acoustic wave cavity may be formed as a decal or the like attached to the body of the sensor. Both the body and the raised area may be formed of an electrically conducting material. Alternatively, only one of the body or the raised area need be formed of an electrically conducting material. Further, by forming, for example, the raised area of a magnetostrictive material, the electromagnetic acoustic transducer need not include a magnet but only the coils.

These and other objects, advantages and novel features of the present invention, as well as details of an illustrated embodiment thereof, will be more fully understood from the following description and drawings.

DETAILED DESCRIPTION OF THE INVENTION

Figure 1:
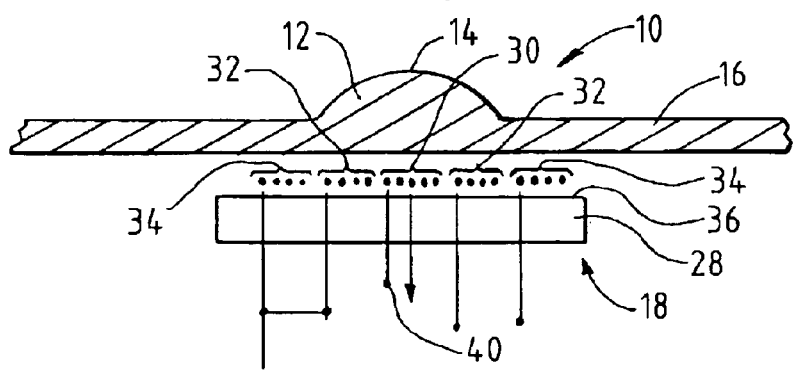
FIG. 1 is a side cross-sectional view of an acoustic wave touch sensor with an electromagnetic acoustic transducer in accordance with the present invention.
Figure 2:
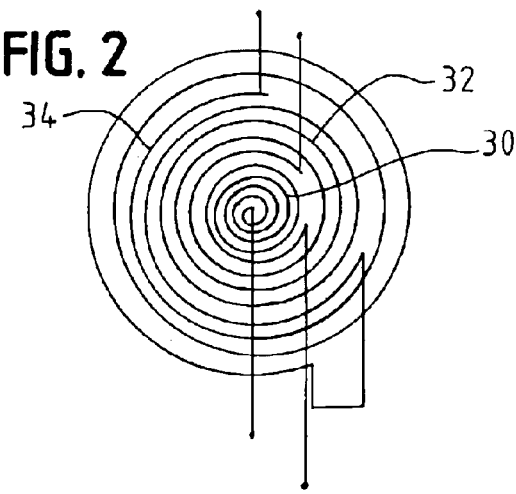
FIG. 2 is a top view of the primary, pickup and noise canceling coils of the acoustic wave touch sensor of FIG. 1.

An acoustic wave sensor 10 in accordance with the present invention, as shown in FIG. 1, includes an acoustic wave cavity 12 defined by the area under the raised surface 14 of the substrate 16. The raised surface 14 also referred to as a mesa defines the acoustic wave cavity 12 such that the mass per unit surface area of the acoustic wave cavity 12 is greater than the mass per unit surface area of the substrate 16 adjacent to the cavity. An electromagnetic acoustic transducer hereinafter referred to as an EMAT 18 is positioned adjacent one surface of the acoustic wave cavity 12 to generate a resonant acoustic wave that is substantially trapped or localized in the cavity 12.

In one embodiment of the present invention, the acoustic wave sensor 10 forms a touch sensor or a touch actuated switch. In this embodiment, the EMAT 18 is positioned adjacent to a surface of the acoustic wave cavity 12 that is opposite the touch surface of the acoustic wave cavity 12. As shown in FIG. 1, the raised surface 14 forms a touch surface for the acoustic wave cavity 12. In another embodiment, however, the raised surface 14 may be positioned adjacent to the EMAT 18. In this embodiment, a symbol may be formed on the touch surface of the acoustic wave cavity 12 to delineate the area to be touched in order to actuate the switch. The resonant acoustic wave generated by the EMAT 18 in the acoustic wave cavity 12 is preferably a shear wave, as discussed below, that is sensitive to contact by a shear wave "absorber" such as a finger or other material but that is insensitive to liquid contaminants. When a shear wave "absorber" contacts the cavity, a detectable change in the shear wave energy trapped in the acoustic wave cavity is produced.

Figure 4:
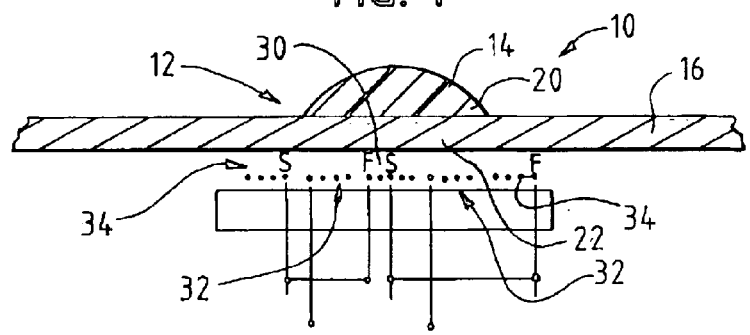
FIG. 4 is a side cross-sectional view of an acoustic wave sensor in accordance with another embodiment of the present invention.

FIG. 1 illustrates an embodiment of the acoustic wave sensor in which the mesa defined by the raised surface 14 is integrally formed of the same material as the body or substrate 16. In this embodiment, the entire acoustic wave cavity is formed of an electrically conducting material so that the EMAT 18 can generate an acoustic wave trapped within the acoustic wave cavity 12. In another embodiment of the present invention as illustrated in FIG. 4, the mesa 20 defined by the raised surface 14 is formed of a different material than the substrate 16. In this embodiment, the mesa 20 forms a decal that is adhered to a surface of the substrate 16. The acoustic wave cavity 12 is formed of the mesa 20 and the area 22 of the substrate 16 underlying the mesa 20. In this embodiment, only one portion of the acoustic wave cavity need be formed of an electrically conductive material. For example, the mesa 20 may be electrically conducting but the area 22 under the mesa and integrally formed as part of the substrate 16 need not be electrically conducting. Preferably, in that example, the mesa should be on the same side of the substrate as the coil. Further, the mesa 20 may be the same or a different electrically conducting material than the substrate 16 as well. Additional details of suitable acoustic wave cavities and feedback mechanisms are described in U.S. patent applications Ser. No. 09/998,355 filed Nov. 20, 2001 and Ser. No. 09/998,220 filed Nov. 20, 2001 incorporated herein by reference.

The acoustic wave sensor 10 of the present invention can use any type of acoustic wave capable of being substantially trapped in the acoustic wave cavity. For simplicity, the sensor 10 will be described for a preferred embodiment that uses a shear wave in a direction that is in the plane of the substrate, wherein the shear wave energy extends in a direction perpendicular to the substrate plane, i.e. through the thickness of the substrate. A shear wave is advantageous because it is insensitive to liquids and other contaminants on the touch surface of the acoustic wave switch 10. Because the fundamental or zeroth order mode of a horizontally polarized shear wave cannot be substantially trapped, higher order shear wave modes are used in accordance with the present invention. It should be appreciated that because the acoustic wave used in accordance with the present invention is trapped the wave is a standing wave. A standing wave has a number of advantages over an acoustic wave that propagates or travels along a path in a substrate. For example, propagating waves are not confined to the main path of propagation but can diffract off of the main path complicating touch detection. This is opposed to a standing wave which by its nature is confined to the area of the cavity. Because the acoustic wave is confined, touch detection is easily accomplished. Further, the wave energy of a propagating wave is not stored at any location along the path. Once the wave passes a point along the path, the wave is gone. This makes timing and control critical for touch detection with propagating waves. There are no timing or control issues with a standing wave because the wave energy is stored in the acoustic wave cavity. Moreover, a propagating wave is not a resonating wave. As such, the wave energy decays as it travels. A standing wave is resonant so that the wave is reinforced and prolonged. As a result, the resonant or standing acoustic wave has a much greater amplitude than an acoustic wave that is not confined.

The raised area or mesa 20 may be formed in the shape of a rectangle resulting in a rectangular cavity. However, when driven by an EMAT, it is preferred that the mesa 20 or raised surface be radially symmetric such as a circular, i.e., disk shaped, mesa or a dome shaped mesa. In a preferred embodiment of the present invention, the raised surface or mesa 20 is formed as a dome that is spherically symmetrical. With these radially symmetric configurations of the raised surface 14 or mesa 20, it has been found that the EMAT may use concentric spiral primary, pickup and noise canceling coils resulting in an acoustic wave sensor with an extremely high Q. For example, acoustic wave cavities formed of low loss metals such as aluminum have Q's on the order of 30,000. This is in contrast to a Q of approximately 500 when a piezoelectric transducer is used. Because the signal level is proportional to Q, the acoustic wave sensor of the present invention provides acceptable signal levels with modest coil currents and simple electronics. The spiral coils of the EMAT generate radially symmetric shear waves that are trapped in radially symmetric cavities, i.e. circular or domed cavities. The excitation of radially symmetric shear waves by the spiral coils in the radially symmetric acoustic wave cavities reduces spurious resonances and improves electrical to acoustic conversion efficiency. Using concentric spiral coils, the primary coil that generates the acoustic wave and the pickup coil as well as noise canceling coils may all be positioned on the same side of the acoustic wave cavity as described below.

Figure 3:
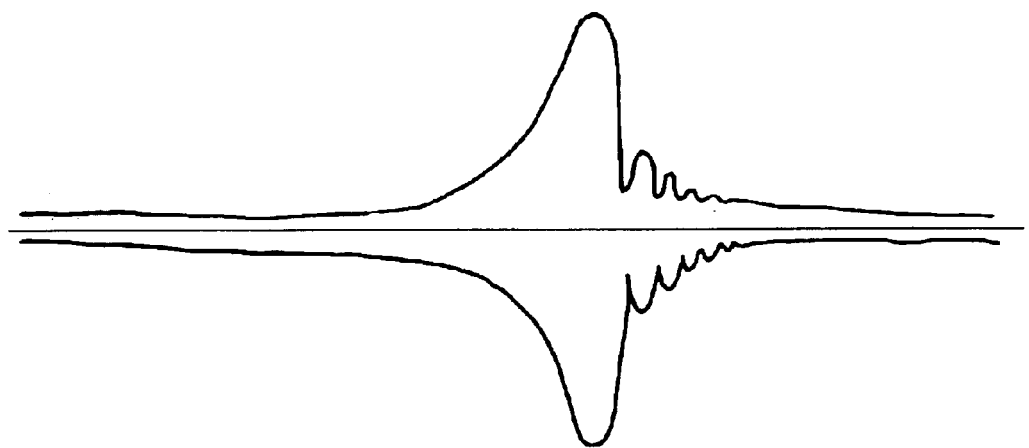
FIG. 3 is a graph illustrating the high Q output of the acoustic wave touch sensor of the present invention.

As shown in a first embodiment of the present invention, the EMAT 18 includes a magnet 28 and concentric, spiral primary coil 30, pickup coil 32 and noise canceling coil 34 mounted on a surface 36 of the magnet 28 spaced from the substrate 16. In this embodiment, the primary coil 30 is the inner-most coil having a drive signal applied to a lead 40 thereof. The pickup coil 32 is a spiral coil adjacent to and concentric with the primary coil 30. In this embodiment, both the primary and pickup coils 30 and 32 are directly beneath the acoustic wave cavity 12. The noise canceling coil 34 is adjacent to the pickup coil 32 and concentric with the primary and pickup coils 30 and 32; however, the acoustic wave cavity 12 does not overlie the noise canceling coil 34. In this embodiment, the outer end of the pickup coil is connected to the outer end of the noise canceling coil and the output signal of the acoustic wave sensor is the voltage between the inner or starting end of the pickup coil 32 and the starting or inner end of the noise canceling coil 34. The primary coil 30 induces a resonant acoustic wave in the cavity 12. The pickup coil 32 carries current induced by the acoustic wave in the cavity 12 and spurious current induced by the primary coil 30. The noise canceling coil 34 picks up only the spurious current induced by the primary coil 30 but does not have current induced by the acoustic wave in the cavity 12 because the coil 34 is outside of the acoustic wave cavity 12. In this embodiment, the turns of the noise canceling coil 34 are adjusted to cancel the spurious current induced in the pickup coil 32 by the primary coil 30 so that the output represents the current induced by the resonant acoustic wave trapped in the cavity 12, the spurious current from the primary coil being cancelled. It should be appreciated that, the current in the noise canceling coil 34 is 180° out of phase with the current in the pickup coil 32 so that the spurious noise from the primary coil is subtracted out from the pickup coil signal leaving only the signal induced by the resonant acoustic wave in the cavity 12. FIG. 3 illustrates the high Q output of the acoustic wave sensor of FIGS. 1, 4 and 7. When the surface of the acoustic wave cavity is touched, the amplitude of the signal changes by an appreciable amount that can be detected to indicate a touch.

Figure 5:
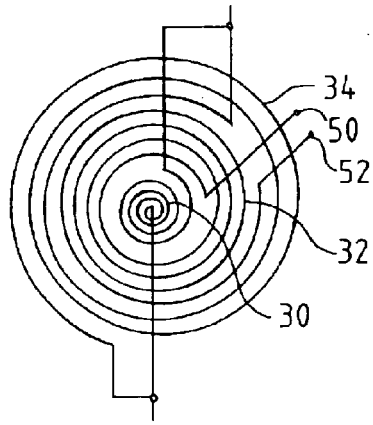
FIG. 5 is a top view of the primary, pickup and noise canceling coils of the acoustic wave sensor of FIG. 4.

In a second embodiment of the present invention, as illustrated in FIGS. 4 and 5, the noise canceling coil 34 is driven 180° out of phase with the primary coil wherein the concentric primary and pickup coils 30 and 32 are directly underneath the acoustic wave cavity 12 whereas the acoustic wave cavity 12 does not overlie the noise canceling coil 34. In this embodiment, the start of the primary coil 30 is connected to the outer or finishing end of the noise canceling coil 34 and the finishing or outer end of the primary coil 30 is connected to the start or inner end of the noise canceling coil 34. The output of the acoustic wave sensor is obtained between the two ends 50 and 52 of the pickup coil, the output representing the acoustic wave energy in the cavity 12 with the spurious current induced by the primary having been cancelled.

Figure 6:
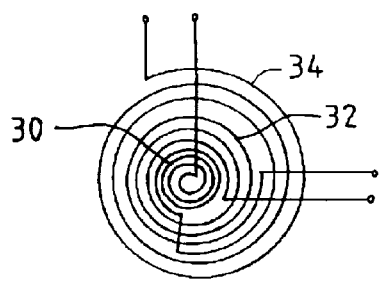
FIG. 6 is a top view of an alternative embodiment of the primary, pickup and noise canceling coil portions of the electromagnetic acoustic transducer.
Figure 7:
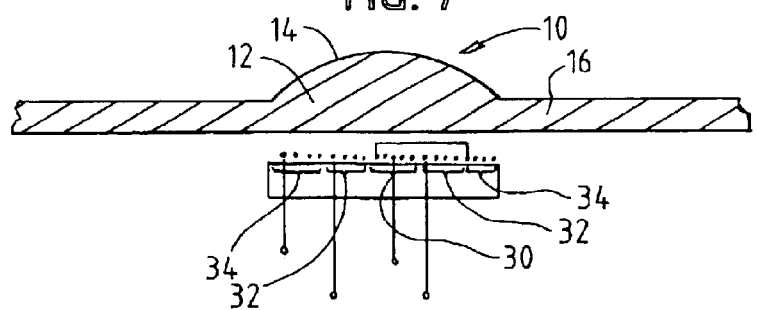
FIG. 7 is a side cross-sectional view of an acoustic wave sensor utilizing the coil configuration of FIG. 6 wherein the cavity overlies all of the coils.

In a third embodiment of the present invention, as shown in FIGS. 6 and 7, one coil forms both the inner primary coil portion 30 and the outer noise canceling portion 34 of the EMAT wherein the pickup coil is disposed in a space between the primary portion 30 and the noise canceling portion 34 of the first coil. In this embodiment, the concentric coils are all contained underneath the acoustic wave cavity so as to provide the most compact EMAT arrangement. More particularly, the primary coil portion 30 forms an inner coil that is connected to the outer most coil portion forming the noise canceling coil portion 34. The pickup coil 32 is concentric with the primary and noise canceling portions of the first coil but is disposed in a space therebetween. The acoustic wave cavity 12 overlies all three coil portions 30, 32 and 34.

Figure 8:
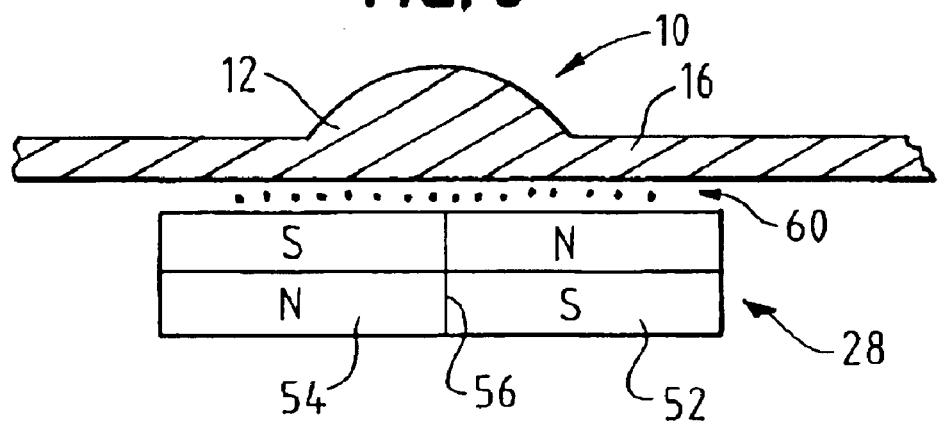
FIG. 8 is a side cross-sectional view of an acoustic wave sensor illustrating one magnet configuration.
Figure 9:
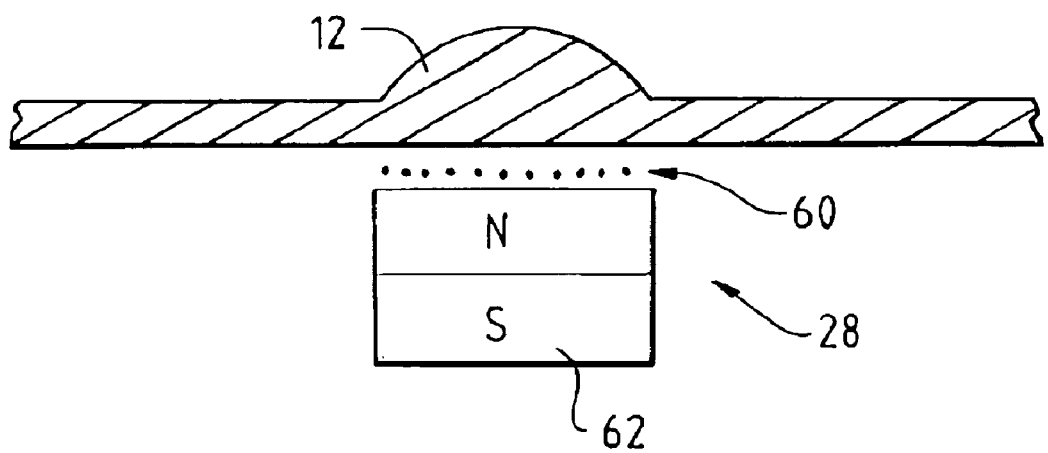
FIG. 9 is a side cross-sectional view of an acoustic wave switch illustrating an alternative magnet configuration.

FIG. 8 illustrates one magnet configuration for the EMAT 28. In this configuration, a magnet 52 with its north pole adjacent the substrate 16 is positioned next to a magnet 54 having its south pole adjacent to the substrate 16 wherein the boundary 56 between the magnets 52 and 54 is aligned with the centerline of the acoustic wave cavity 12. In this embodiment, the spiral coils 60 are concentric with the center of the coils being aligned with the boundary 56 between the magnets 52 and 54. This embodiment generates a plane shear wave in the acoustic wave cavity 12 and has the highest Q. In another embodiment, as shown in FIG. 9, the EMAT includes a single magnet 62, the north pole of which is adjacent the acoustic wave cavity 12. In this embodiment, the primary coil of the concentric spiral coils 60 generates radial shear waves.

Many modifications and variations of the present invention are possible in light of the above teachings. For example, if the mesa 14 or the underlying substrate portion of the acoustic wave cavity is formed of a magnetostrictive material or a piezomagnetic material, the magnet 28 may not be needed. Thus, it is to be understood that, within the scope of the appended claims, the invention may be practiced otherwise than as described hereinabove.

What is claimed and desired to be secured by Letters Patent is:

1. An acoustic wave touch sensor comprising:
   a body with an acoustic wave cavity formed therein and defined by a raised area, the acoustic wave cavity having a touch surface and at least a portion of the acoustic wave cavity being formed of an electrically conducting material; and
   an electromagnetic acoustic transducer positioned adjacent to a surface of the acoustic wave cavity opposite the touch surface, the electromagnetic acoustic transducer having a primary coil generating a resonant acoustic wave in the acoustic wave cavity and a pickup coil providing an electrical output signal, wherein a touch on the touch surface produces a detectable change in the electrical output signal.

2. An acoustic wave touch sensor as recited in claim 1 wherein the entire acoustic wave cavity is formed of an electrically conducting material.

3. An acoustic wave touch sensor as recited in claim 1 wherein the acoustic wave cavity is formed in part of a non-conducting material and in part of an electrically conducting material.

4. An acoustic wave touch sensor as recited in claim 3 wherein the non-conducting material forms at least a portion of the body and the electrically conducting material is mounted on the body and defines the acoustic wave cavity.

5. An acoustic wave touch sensor as recited in claim 4 wherein the touch surface is formed on the electrically conducting material.

6. An acoustic wave touch sensor as recited in claim 4 wherein the touch surface is formed on the non-conducting material.

7. An acoustic wave touch sensor as recited in claim 1 including a noise canceling coil.

8. An acoustic wave touch sensor as recited in claim 7 wherein the primary and pickup coils are positioned under the acoustic wave cavity and the noise canceling coil is not under the acoustic wave cavity.

9. An acoustic wave touch sensor as recited in claim 7 wherein the primary pickup and noise canceling coils are positioned under the acoustic wave cavity.

10. An acoustic wave touch sensor as recited in claim 1 wherein the primary coil has a first portion and a spaced second portion and the pickup coil is disposed in the space between the first and second primary coil portions.

11. An acoustic wave sensor comprising:
    a body with a radially symmetric raised surface defining an acoustic wave cavity with at least a portion of the acoustic wave cavity being formed of an electrically conducting material; and
    an electromagnetic acoustic transducer positioned adjacent one surface of the acoustic wave cavity, the electromagnetic transducer including a pair of spiral coils, one coil forming a primary coil generating a resonant acoustic wave in the acoustic wave cavity and the other coil forming a pickup coil.

12. An acoustic wave sensor as recited in claim 11 wherein the primary coil and the pickup coil are concentric.

13. An acoustic wave sensor as recited in claim 12 including a noise canceling coil that is concentric with the primary and secondary coils.

14. An acoustic wave sensor as recited in claim 13 wherein the primary coil forms an inner coil, the noise canceling coil forms an outer coil and the pickup coil is disposed between the primary coil and noise canceling coil.

15. An acoustic wave sensor as recited in claim 13 wherein the primary and pickup coils are positioned under the acoustic wave cavity and the noise canceling coil is not under the acoustic wave cavity.

16. An acoustic wave sensor as recited in claim 13 wherein the primary, pickup and noise canceling coils are positioned under the acoustic wave cavity.

17. An acoustic wave sensor as recited in claim 11 wherein the raised surface is circular.

18. An acoustic wave sensor as recited in claim 11 wherein the raised surface is a dome.

19. An acoustic wave sensor as recited in claim 11 wherein the raised surface is spherically symmetrical.

20. An acoustic wave sensor as recited in claim 11 wherein the raised surface is integrally formed with the body.

21. An acoustic wave sensor as recited in claim 11 wherein the raised surface is attached to the body.

22. An acoustic wave sensor as recited in claim 11 wherein the electromagnetic acoustic transducer is adjacent a surface of the acoustic wave cavity opposite of the raised surface.

23. An acoustic wave sensor as recited in claim 11 wherein the electromagnetic acoustic transducer is adjacent the raised surface of the acoustic wave cavity.

24. An acoustic wave sensor as recited in claim 11 wherein the entire acoustic wave cavity is formed of an electrically conducting material.

25. An acoustic wave sensor as recited in claim 11 wherein the acoustic wave cavity is formed in part of a non-conducting material and in part of an electrically conducting material.

26. An acoustic wave sensor comprising:
    a body with a domed surface thereon defining an acoustic wave cavity with at least a portion of the acoustic wave cavity being formed of an electrically conducting material; and
    an electromagnetic acoustic transducer having a spiral primary coil portion generating a resonant acoustic wave in the acoustic wave cavity, a spiral pickup coil portion and a spiral noise canceling coil portion, the acoustic wave cavity overlying at least the primary coil portion and the pickup coil portion.

27. An acoustic wave sensor as recited in claim 26 wherein the primary coil portion, the pickup coil portion, and the noise canceling coil portion are concentric.

28. An acoustic wave sensor as recited in claim 26 wherein the noise canceling coil position is adjacent one of the other coil portions but the acoustic wave cavity does not overlie the noise canceling coil portion.

29. An acoustic wave sensor as recited in claim 26 wherein the acoustic wave cavity overlies the noise canceling coil portion.

30. An acoustic wave sensor as recited in claim 26 wherein the noise canceling coil portion and the primary coil portions are part of the same coil and the pickup coil portion is disposed between the primary and noise canceling coil portions.

31. An acoustic wave sensor as recited in claim 26 wherein the noise canceling coil portion and the pickup coil portion are part of the same coil and the primary coil portion is disposed between the pickup coil portion and the noise canceling coil portions.

32. An acoustic wave sensor as recited in claim 26 wherein the current in the noise canceling coil is 180° out of phase with the current in the primary coil.

33. An acoustic wave sensor as recited in claim 26 wherein the domed surface is integrally formed with the body.

34. An acoustic wave sensor as recited in claim 26 wherein the domed surface is attached to the body.

35. An acoustic wave sensor as recited in claim 26 wherein the entire acoustic wave cavity is formed of an electrically conducting material.

36. An acoustic wave sensor as recited in claim 26 wherein the acoustic wave cavity is formed in part of a non-conducting material and in part of an electrically conducting material.

37. An acoustic wave sensor as recited in claim 26 wherein the dome's surface is spherically symmetrical.

38. An acoustic wave sensor comprising:
a body with an acoustic wave cavity formed therein and defined by a raised area, at least a portion of the acoustic wave cavity being formed of an electrically conducting material; and
an electromagnetic acoustic transducer having a primary coil portion generating a resonant acoustic wave in the acoustic wave cavity, a pickup coil portion providing an output signal and a noise canceling coil portion adjacent to at least one of the other coil portions to reduce noise in the output signal, the acoustic wave cavity overlying at least the primary coil portion and the pickup coil portion.

39. An acoustic wave sensor comprising:
a body with a radially symmetric raised surface defining an acoustic wave cavity with at least a portion of the acoustic wave cavity being formed of an electrically conducting materials; and
an electromagnetic acoustic transducer positioned adjacent one surface of the acoustic wave cavity, the electromagnetic transducer including a pair of magnets positioned side by side wherein the north pole of one magnet is adjacent the south pole of the other magnet and the boundary between the magnets is aligned with a centerline of the acoustic wave cavity, and the electromagnetic transducer including a pair of concentric spiral coils one coil forming a primary coil generating an acoustic wave in the acoustic wave cavity and another coil forming a pickup coil.

40. An acoustic wave sensor as recited in claim 39 wherein the center of the spiral coil is aligned with the boundary between the magnets and the centerline of the acoustic wave cavity.

41. An acoustic wave sensor as recited in claim 39 including a spiral noise canceling coil portion that is concentric with the primary and pickup coil portions of the electromagnetic acoustic transducer.

42. An acoustic wave sensor as recited in claim 41 wherein the acoustic wave cavity overlies the primary, pickup and noise canceling coil portions.

43. An acoustic wave sensor as recited in claim 41 wherein the acoustic wave cavity overlies the primary and pickup coil portions but does not overlie the noise canceling coil portions.

* * * * *